United States Patent
Kim et al.

(10) Patent No.: US 11,999,255 B2
(45) Date of Patent: Jun. 4, 2024

(54) PERSONAL MOBILITY AND METHOD OF CONTROLLING THE SAME

(71) Applicants: Hyundai Motor Company, Seoul (KR); Kia Corporation, Seoul (KR)

(72) Inventors: Duck Young Kim, Seongnam-si (KR); Donghee Seok, Suwon-si (KR); Ilsun Song, Seongnam-si (KR); Hee Jin Ro, Seoul (KR); Yocheol Jang, Suwon-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 507 days.

(21) Appl. No.: 17/462,380

(22) Filed: Aug. 31, 2021

(65) Prior Publication Data

US 2022/0144127 A1    May 12, 2022

(30) Foreign Application Priority Data

Nov. 12, 2020    (KR) .......................... 10-2020-0150989

(51) Int. Cl.
| | |
|---|---|
| *B60L 58/10* | (2019.01) |
| *B60L 50/60* | (2019.01) |
| *B60L 50/64* | (2019.01) |
| *G01R 31/3835* | (2019.01) |
| *G01R 31/52* | (2020.01) |

(52) U.S. Cl.
CPC ............... *B60L 58/10* (2019.02); *B60L 50/64* (2019.02); *B60L 50/66* (2019.02); *G01R 31/3835* (2019.01); *G01R 31/52* (2020.01); *B60L 2200/24* (2013.01)

(58) Field of Classification Search
CPC ........................................................ B60L 58/10
USPC .......................................................... 320/136
See application file for complete search history.

(56) References Cited

U.S. PATENT DOCUMENTS

| | | | | |
|---|---|---|---|---|
| 5,870,685 | A * | 2/1999 | Flynn ................ | H02J 7/007182 340/7.37 |
| 2015/0263561 | A1* | 9/2015 | Trock .................... | H02J 7/0048 320/135 |
| 2017/0292997 | A1* | 10/2017 | You ..................... | H01M 10/482 |

* cited by examiner

*Primary Examiner* — Yalkew Fantu
(74) *Attorney, Agent, or Firm* — MORGAN, LEWIS & BOCKIUS LLP

(57) ABSTRACT

A personal mobility includes first and second test voltage sources, first and second switches, a ground, a first sensor, a second sensor obtaining weight information of a user, and a controller to: based on startup of the personal mobility, measure a first voltage applied to the first switch provided between the first test voltage source and the ground through the first sensor and a second voltage applied to the second switch provided between the second test voltage source and the ground, assign the user to one of predetermined groups based on the weight information, and based on a case in which at least one of the first or second voltage is greater than or equal to a reference value by comparing the first and second voltages with the reference value previously allocated to a group to which the user is assigned among the plurality of predetermined groups, control alarm device to provide a warning alarm to the user.

16 Claims, 8 Drawing Sheets

PERSONAL MOBILITY AND METHOD OF CONTROLLING THE SAME

CROSS-REFERENCE TO RELATED APPLICATION(S)

The present application claims priority to Korean Patent Application No. 10-2020-0150989, filed on Nov. 12, 2020, the entire contents of which is incorporated herein for all purposes by this reference.

BACKGROUND OF THE INVENTION

Field of the Invention

The present invention relates to a personal mobility and a method of controlling the same.

Description of Related Art

A personal mobility is a transportation device for one person, which is an electricity-driven, and a frequency of use thereof has rapidly increased in recent years. In line with this, a research on the personal mobility is being actively conducted. In particular, as the frequency of use of personal mobility increases, an accident related to the personal mobility frequently occurs. In addition to collision accidents of the personal mobility, there are also accidents in which a user is electrocuted due to an occurrence of a short circuit in an internal circuit of the personal mobility. Accordingly, a research is being actively conducted to prevent accidents in which users are electrocuted.

In particular, it is necessary to block a possibility of occurrence of the short circuit before the user starts the personal mobility. It is not necessary to uniformly determine a possibility of an electric shock, but to respond flexibly by distinguishing whether the user is an adult or a child.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a personal mobility of obtaining a voltage applied to a resistance between positive and negative electrodes of a battery and a main body and determining whether there is a short circuit by comparing a reference value according to each obtained voltage and a weight, and a method of controlling the personal mobility.

Additional aspects of the present invention will be set forth in part in the description which follows, and in part, will be obvious from the description, or may be learned by practice of the present invention.

According to various aspects of the present invention, there is provided a personal mobility including: an alarm device; a detection circuit including a first test voltage source, a second test voltage source, a first switch, a second switch, and a ground; a first sensor configured to detect outputs of the first test voltage source and the second test voltage source; a second sensor configured to obtain weight information of a user; and a controller configured to: in response to a startup of the personal mobility, measure a first voltage applied to the first switch provided between the first test voltage source and the ground through the first sensor and a second voltage applied to the second switch provided between the second test voltage source and the ground, assign the user to one of a plurality of predetermined groups according to the obtained weight information of the user, and when the controller determines that at least one of the first voltage or the second voltage is greater than or equal to a reference value by comparing the first voltage and the second voltage with the reference value previously allocated to a group to which the user is assigned among the plurality of predetermined groups, control the alarm device electrically or wirelessly connected to the controller, to provide a warning alarm to the user.

The detection circuit may further include a third switch located between the first test voltage source and the first switch, and a fourth switch located between the second test voltage source and the second switch. The controller may be configured to: electrically connect the first test voltage source and the first switch through the third switch, open the fourth switch to detect the first voltage, and control the detection circuit to determine whether a short circuit occurs in a positive (+) electrode of a battery based on the first voltage.

The controller may be configured to: electrically connect the second test voltage source and the second switch through the fourth switch, open the third switch to detect the second voltage, and control the detection circuit to determine whether the short circuit occurs in a negative (−) electrode of the battery based on the second voltage.

The personal mobility may further include the battery, a fifth switch, and a sixth switch. The fifth switch may be located between the positive (+) electrode of the battery and the third switch. The sixth switch may be located between the negative (−) electrode of the battery and the fourth switch. The controller may be configured to: in a case of electrically connecting the first test voltage source and the first switch through the third switch, control the detection circuit to detect the first voltage by opening the first switch, the second switch, the fourth switch, the fifth switch, and the sixth switch, and in a case of electrically connecting the second test voltage source and the second switch through the fourth switch, control the detection circuit to detect the second voltage by opening the first switch, the second switch, the third switch, the fifth switch, and the sixth switch.

The personal mobility may further include a storage electrically connected to the controller and configured to store reference authentication information. The controller may be configured to compare an authentication device of the user with the reference authentication information and assign the user to one of the plurality of predetermined groups according to the reference authentication information corresponding to the authentication device of the user.

In a response to a case of stopping of the personal mobility for a predetermined time period or longer than the predetermined time period while driving the personal mobility, the controller may be configured to control the alarm device to provide the warning alarm to the user when the controller determines that the at least one of the first voltage or the second voltage is equal to or greater than the reference value.

The personal mobility may further include a communicator configured to transmit a warning signal to a management server. The controller may be configured to control to transmit the warning signal to the management server through the communicator when the controller determines that the at least one of the first voltage or the second voltage corresponds to the reference value or more.

According to various aspects of the present invention, there is provided a method of controlling a personal mobility, the personal mobility including a detection circuit including a first test voltage source, a second test voltage source, a first switch, a second switch, and a ground. The method including: detecting, by a first sensor, outputs of the first test voltage source and the second test voltage source; obtaining, by a second sensor, weight information of a user; in response to a startup of the personal mobility, measuring, by a controller, a first voltage applied to the first switch provided between the first test voltage source and the ground through the first sensor and a second voltage applied to the second switch provided between the second test voltage source and the ground; assigning, by the controller, the user to one of a plurality of predetermined groups according to the obtained weight information obtained through the first sensor; and when the controller determines that at least one of the first voltage or the second voltage is greater than or equal to a reference value by comparing the first voltage and the second voltage with the reference value previously allocated to a group to which the user is assigned among the plurality of predetermined groups, providing, by the controller, a warning signal to the user.

The detection circuit may further include a third switch located between the first test voltage source and the first switch, and a fourth switch located between the second test voltage source and the second switch. The measuring of the first voltage may include electrically connecting the first test voltage source and the first switch through the third switch, and controlling the detection circuit to open the fourth switch.

The measuring of the second voltage may include electrically connecting the second test voltage source and the second switch through the fourth switch, and controlling the detection circuit to open the third switch.

The detection circuit may further include the battery, a fifth switch, and a sixth switch. The fifth switch may be located between the positive (+) electrode of the battery and the third switch. The sixth switch may be located between the negative (−) electrode of the battery and the fourth switch. The measuring of the first voltage and the second voltage may include, in a case of electrically connecting the first test voltage source and the first switch through the third switch, control the detection circuit to open the first switch, the second switch, the fourth switch, the fifth switch, and the sixth switch, and in a case of electrically connecting the second test voltage source and the second switch through the fourth switch, control the detection circuit to open the first switch, the second switch, the third switch, the fifth switch, and the sixth switch.

The assigning of the user to one of the plurality of predetermined groups may include comparing an authentication device of the user with the reference authentication information and assigning the user to one of the plurality of predetermined groups according to the reference authentication information corresponding to the authentication device of the user.

The method may further include, in a response to a case of stopping of the personal mobility for a predetermined time period or longer than the predetermined time period while driving the personal mobility, providing, by the controller, the warning signal to the user through an alarm device when the controller determines that at least one of the first voltage or the second voltage is equal to or greater than the reference value.

The method may further include controlling, by the controller, the communicator to transmit the warning signal to a management server through the communicator electrically or wirelessly connected to the controller when the controller determines that the at least one of the first voltage or the second voltage corresponds to the reference value or more than the reference value.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
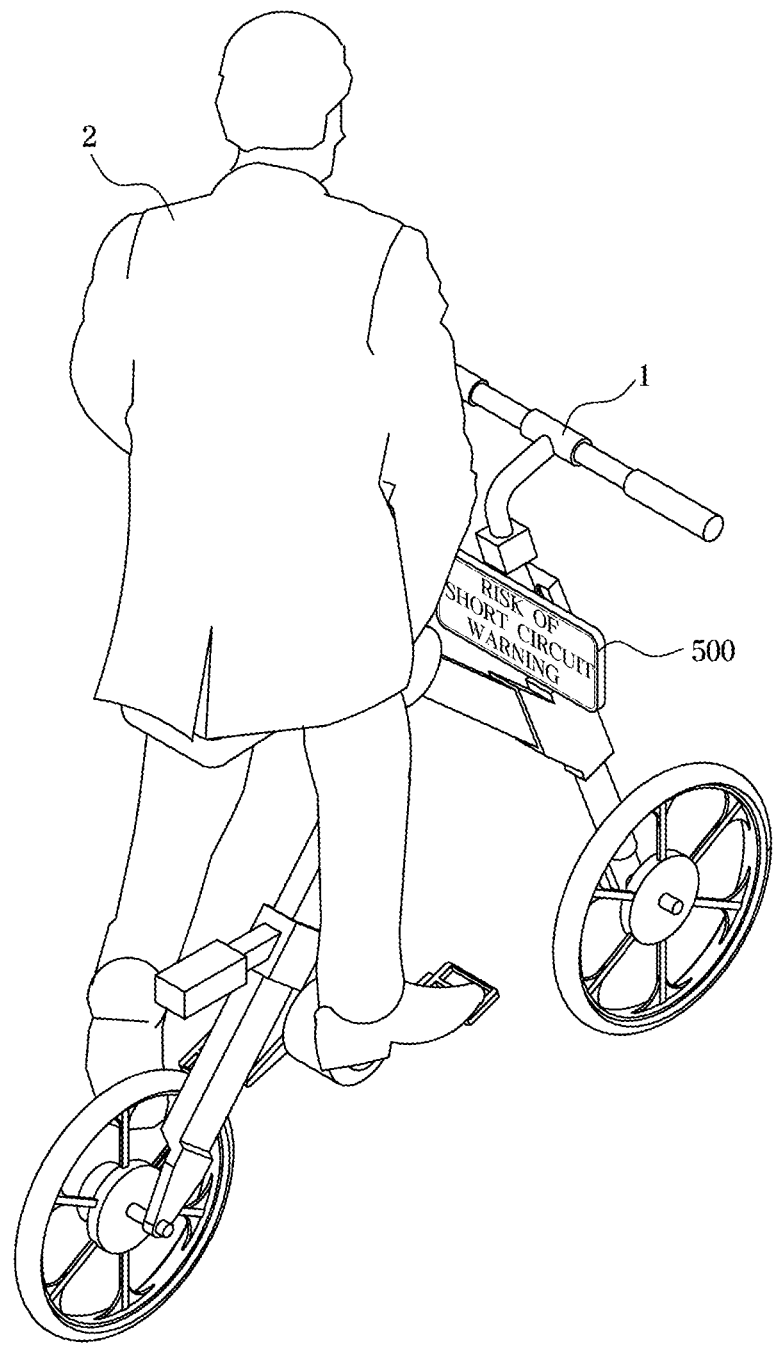
FIG. 1 is a view exemplarily illustrating an operation of warning a user of a risk of short circuit according to various exemplary embodiments of the present invention.

It may be understood that the appended drawings are not necessarily to scale, presenting a somewhat simplified representation of various features illustrative of the basic principles of the invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments of the present invention, it will be understood that the present description is not intended to limit the invention(s) to those exemplary embodiments. On the other hand, the invention(s) is/are intended to cover not only the exemplary embodiments of the present invention, but also various alternatives, modifications, equivalents and other embodiments, which may be included within the spirit and scope of the invention as defined by the appended claims.

Like reference numerals refer to like elements throughout the specification. Not all elements of the exemplary embodiments of the present invention will be described, and the description of what are commonly known in the art or what overlap each other in the exemplary embodiments will be omitted. The terms as used throughout the specification, such as "~part," "~module," "~member," "~block," etc., may be implemented in software and/or hardware, and a plurality of "~parts," "~modules," "~members," or "~blocks" may be implemented in a single element, or a single "~part," "~module," "~member," or "~block" may include a plurality of elements.

It will be further understood that the term "connect" and its derivatives refer both to direct and indirect connection, and the indirect connection includes a connection over a wireless communication network.

The terms "include (or including)" and "comprise (or comprising)" are inclusive or open-ended and do not exclude additional, unrecited elements or method steps, unless otherwise mentioned.

Furthermore, when it is stated that a layer is "on" another layer or substrate, the layer may be directly on another layer or substrate or a third layer may be disposed therebetween.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

It is to be understood that the singular forms "a," "an," and "the" include plural references unless the context clearly dictates otherwise.

Reference numerals used for method steps are merely used for convenience of explanation, but not to limit an order of the steps. Thus, unless the context clearly dictates otherwise, the written order may be practiced otherwise.

Hereinafter, an operation principle and embodiments of the present invention will be described with reference to accompanying drawings.

Figure 2:
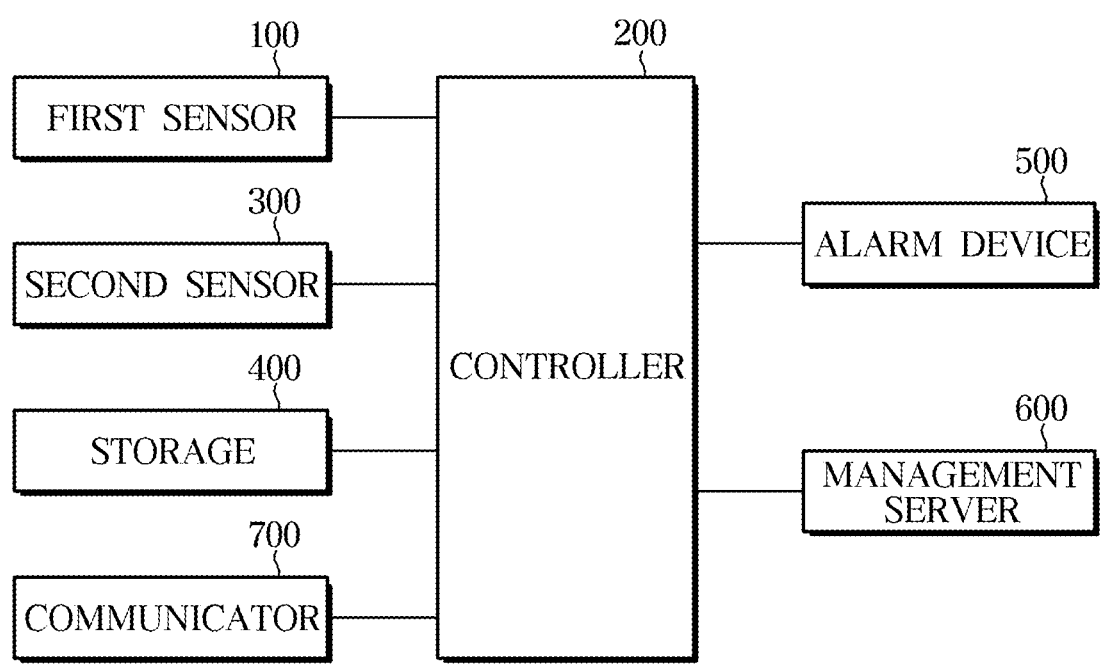
FIG. 2 is a control block diagram of a personal mobility according to various exemplary embodiments of the present invention.
Figure 3:
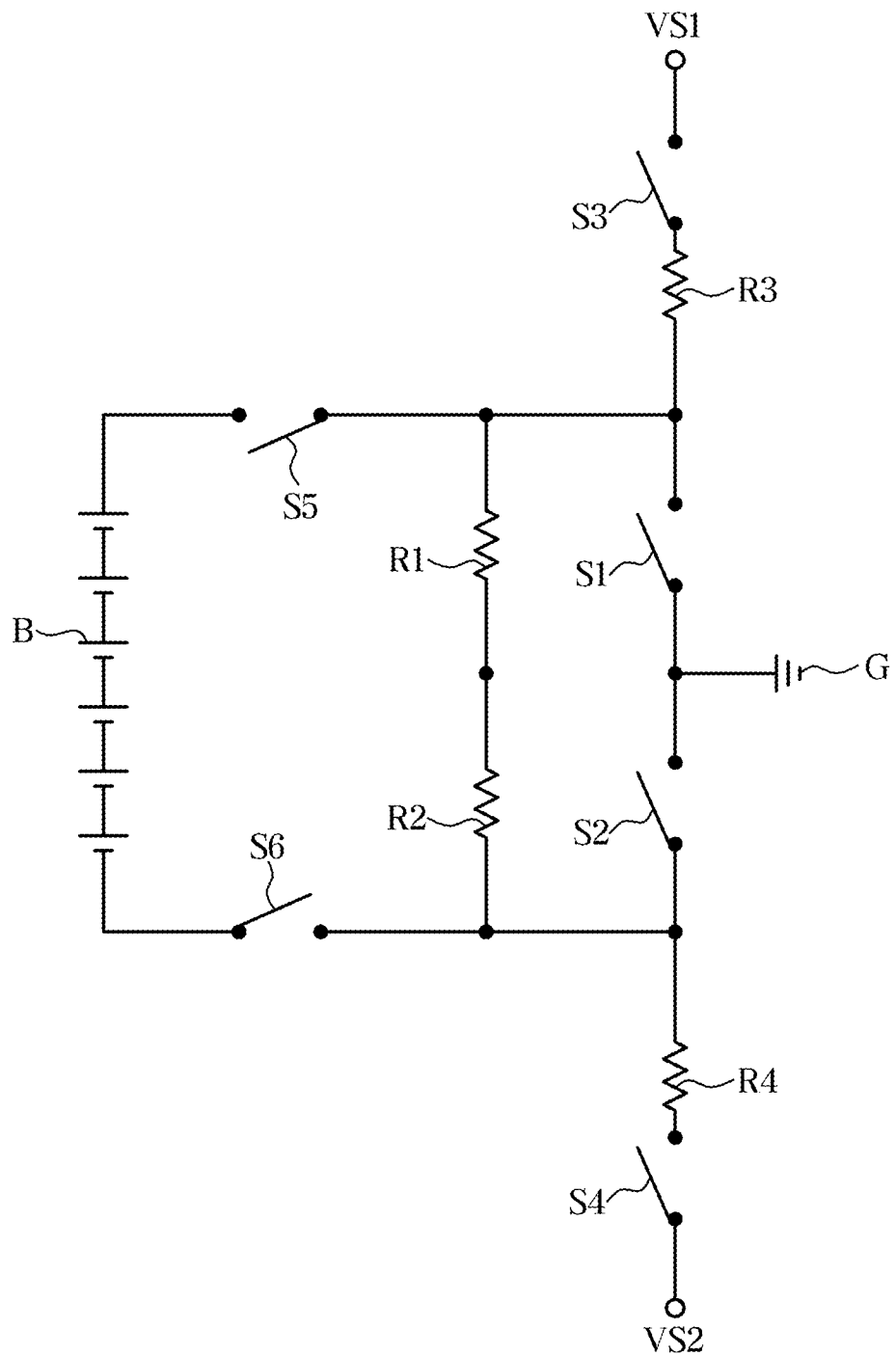
FIG. 3 is a view exemplarily illustrating a detection circuit virtually generated when a positive (+) electrode and a negative (−) electrode of a battery become short according to various exemplary embodiments of the present invention.

FIG. 1 is a view exemplarily illustrating an operation of warning a user of a risk of short circuit according to various exemplary embodiments of the present invention, FIG. 2 is a control block diagram of a personal mobility according to various exemplary embodiments of the present invention, and FIG. 3 is a view exemplarily illustrating a detection circuit virtually generated when a positive (+) electrode and a negative (−) electrode of a battery become short according to various exemplary embodiments of the present invention.

Referring to FIGS. 1 to 3, a personal mobility 1 may include a detection circuit including an alarm device 500, a first test voltage source VS1, a second test voltage source VS2, a first switch S1, a second switch S2, a third switch S3, and a third switch, a fourth switch S4, a fifth switch S5, a sixth switch S6, a battery B and a ground G, a first sensor 100 that detects outputs of the first test voltage source VS1 and the second test voltage source VS2, a second sensor 300 that obtains weight information of a user, and a controller 200.

When a startup of the personal mobility 1 is turned on, the controller 200 may measure a first voltage applied to the first switch S1 between the first test voltage source VS1 and the ground G and a second voltage applied to the second switch S2 between the second test voltage source VS2 and the ground G through the first sensor 100. The controller 200 may assign the user to one of a plurality of predetermined groups based on the weight information obtained through the second sensor 300, and compare the first voltage and the second voltage with a reference value previously allocated to a group to which the user is assigned. When at least one of the first voltage or the second voltage corresponds to a reference value or more, the controller 200 may control the alarm device 500 to provide a warning alarm to the user.

The alarm device 500 may include a display, and may also include various devices configured for providing an alarm to a user 2. The first test voltage source VS1 and the second test voltage source VS2 may refer to devices that pass a current to identify whether there is a short circuit. The first test voltage source VS1 may receive a power from the battery B, and may refer to a device which is separately present and transmits the current.

A first resistance R1 and a second resistance R2 may refer to a resistance located between the first test voltage source VS1 and a main body of the personal mobility 1 that a body of the user 2 contacts with. In the instant case, the first resistance R1 and the second resistance R2 are virtual resistances, and may refer to virtual resistances which may occur when a leakage current occurs.

The first resistance R1 and the second resistance R2 are virtually existing resistances that are connected in parallel to the first switch S1 and the second switch S2, respectively, when the leakage current occurs. This may refer to the virtual resistance for measuring a voltage measured by the occurrence of the leakage current in the switch S1 and the second switch S2. The first resistance R1 may refer to a resistance for identifying a current between the positive (+) electrode of the battery B and the main body of the personal mobility 1 by connecting with the positive (+) electrode of the battery B. The second resistance R2 may refer to a resistance for identifying a current between the negative (−) electrode of the battery B and the main body of the personal mobility 1 by connecting with the negative (−) electrode of the battery B. The first resistance R1 and the second resistance R2 may refer to virtual insulation resistances to express an insulation resistance between a chassis and the battery B in a circuit. The first resistance R1 and the second resistance R2 may refer to resistances for measuring the insulation resistance between the main body of the personal mobility 1 in which the positive electrode of the battery B and the body of the user 2 are in contact and the main body of the personal mobility 1 in which the negative electrode of the battery B and the body of the user 2 are in contact.

The first sensor 100 may detect the outputs of the first test voltage source VS1 and the second test voltage source VS2. At the instant time, the first sensor 100 may measure a voltage applied to all resistances in the detection circuit. The ground G may refer to a ground.

The detection circuit may refer to a circuit necessary to identify whether there is the short circuit. The detection circuit may include the third switch S3, the fourth switch S4, the first switch S1, the second switch S2, the fifth switch S5, and the sixth switch S6. The second sensor 300 may include a pressure sensor that detects a pressure.

The second sensor 300 may be located in the main body of the personal mobility 1, and the position may not be limited to the main body. The predetermined plurality of groups may be divided into an adult group and a child group. At the instant time, it is possible to subdivide the group by subdividing the group rather than the two groups of adults and children. When it is divided into the adult group and the child group, the weight may be measured through the second sensor 300, and those above a certain weight may be assigned as the adults and those below the certain weight may be assigned as the children. As will be described later, it may be divided into the adult group and the child group through a user authentication device as well as the second sensor. The pre-allocated reference value may refer to a value which is a pre-allocated reference value to each of a plurality of predetermined groups. For example, when it is divided into the adult group and the child group, the children may be more susceptible to the leakage current. Therefore, for safety, it is necessary to set the reference value low for the children, and for the adults, it may be safe even if the reference value is set relatively higher than for the children. Therefore, it is necessary to set different reference value for the group classified as the adults and the group classified as the children. Thereafter, the first voltage and the second voltage are compared with the reference value, and if at least one of the first voltage or the second voltage is greater than the reference value, it may be determined as the short circuit. A reference for determining the reference value is that in a case of the positive (+) electrode of the battery B, only the third switch S3 is closed and the voltage applied to the first switch S1 is measured. Thereafter, the third switch S3 and the first switch S1 are closed and the voltage applied to the first switch S1 is measured, compared, and then set. In a case of the negative (−) electrode of the battery B, only the fourth switch S4 is closed and the voltage applied to the second switch S2 is measured. Thereafter, the fourth switch S4 and the second switch S2 are closed and the voltage applied to the second switch S2 is measured, compared, and then set. A method of measuring the first voltage and the second voltage will be described in detail later.

When it is determined that there is the short circuit, the warning alarm may be provided through the alarm device 500. Closing the switch may mean allowing the current to be connected through the switch, as opposed to opening the switch. Also closing the switch may refer to shorting the switch. Looking particularly, the detection circuit may include the third switch S3, the fourth switch S4, the first switch S1, the second switch S2, the fifth switch S5, the sixth switch S6, the first resistance R1, the second resistance R2, a third resistance R3, a fourth resistance R4, the first test voltage source VS1, the second test voltage source VS2, the ground G, and the battery B. The third switch S3 may be located between the first test voltage source VS1 and the third resistance R3, and the fifth switch S5 may be located between the third resistance R3 and the positive (+) electrode of the battery B. The first resistance R1 and the fourth switch S4 may be connected in parallel between the fifth switch S5 and the ground G. The second switch S2 may be located between the second test voltage source VS2 and the fourth resistance R4, and the sixth switch S6 may be located between the negative (−) electrode of the battery B and the fourth resistance R4, and the second resistance R2 and the first switch S1 may be connected in parallel between the ground G and the sixth switch S6. When the first voltage and the second voltage come out higher than the reference value, the user 2 may be alerted through the alarm device 500, and furthermore, a warning signal may be transmitted to a management server 600 through a communicator 700.

The management server 600 may receive the warning signal from the personal mobility 1. The management server 600 may refer to a server that an administrator in charge of managing the personal mobility 1 may refer to, and may refer to a server that collects information related to the personal mobility 1. when an operation of the personal mobility 1 is restricted, a main contactor may be opened in a Battery Management System (BMS), and the administrator of the personal mobility 1 may be alerted that the insulation resistance has broken, and then repaired may be induced.

Furthermore, when the personal mobility 1 stops for a predetermined time period or more while driving, the controller 200 may provide the warning alarm to the user 2 when at least one of the first voltage or the second voltage corresponds to the reference value or more. For example, if the user 2 is taking a rest for the predetermined time period while driving the personal mobility 1, it may be determined that the user 2 is taking a break or waiting. In the instant case, it is possible to check whether there is the leakage current again for the safety. The operation of determining whether there is the leakage current is as described above. The communicator may transmit the warning signal to the management server.

The communicator 700 may include one or more components that enable communication with the external apparatus, for example, at least one of a short-range communication module, a wired communication module, and a wireless communication module.

The short-range communication module may include various short-range communication modules for transmitting and receiving signals within a short range over a wireless communication network, such as a Bluetooth module, an infrared communication module, a radio frequency identification (RFID) communication module, a wireless local access network (WLAN) communication module, a near field communication (NFC) module, a Zigbee communication module, etc.

The wired communication module may include not only one of the various wired communication modules, such as a local area network (LAN) module, a wide area network (WAN) module, or a value added network (VAN) module, but also one of various cable communication modules, such as a universal serial bus (USB), a high definition multimedia interface (HDMI), a digital visual interface (DVI), recommended standard (RS) 232, a power cable, or a plain old telephone service (POTS).

The wireless communication module may include a wireless fidelity (WiFi) module, a wireless broadband (WiBro) module, and/or any wireless communication module for supporting various wireless communication schemes, such as a global system for a mobile communication (GSM) module, a code division multiple access (CDMA) module, a wideband code division multiple access (WCDMA) module, a universal mobile telecommunications system (UMTS), a time division multiple access (TDMA) module, a long-term evolution (LTE) module, etc.

The wireless communication module may include a wireless communication interface including an antenna and a transmitter for transmitting various signals. Furthermore, the wireless communication module may further include a signal converting module for converting a digital control signal output from the controller 200 through the wireless communication interface into an analog type wireless signal under the control of the controller 200.

The wireless communication module may include the wireless communication interface including the antenna and a receiver for receiving various signals. Furthermore, the wireless communication module may further include the signal converting module for demodulating an analog type wireless signal received through the wireless communication interface into a digital control signal.

The storage 400 may be implemented with at least one of a non-volatile memory device, such as cache, read only memory (ROM), programmable ROM (PROM), erasable programmable ROM (EPROM), electrically erasable programmable ROM (EEPROM), a volatile memory device, such as random access memory (RAM), or a storage medium, such as a hard disk drive (HDD) or a compact disk (CD) ROM, without being limited thereto. The storage 400 may be a memory implemented with a chip separate from a processor, which is described below in relation to the controller 200. The storage 400 may be implemented integrally with the processor in a single chip.

The display may be provided as a cathode ray tube (CRT), a digital light processing (DLP) panel, a plasma display panel, a liquid crystal display (LCD) panel, and an electro luminescence (EL) panel, an electrophoretic display (EPD) panel, an electrochromic display (ECD) panel, a light emitting diode (LED) panel, an organic light emitting diode (OLED) panel, etc., but is not limited thereto.

The inputter may include hardware devices such as various buttons or switches, pedals, keyboards, mice, trackballs, various levers, handles, sticks, or the like for user input.

Furthermore, the inputter may include a graphical user interface (GUI) such as a touch pad for user input, that is, a software device. The touch pad may be implemented as a touch screen panel (TSP) to form a mutual layer structure with the display.

When the TSP forms the mutual layer structure with the touch pad, the display may also be used as the inputter.

The controller 200 is a processor that controls all operations of the personal mobility 1, and may be a processor of an electronic control unit (ECU) that controls overall operations of the power system. Furthermore, the controller 200 may control operations of various modules and devices built into the personal mobility 1. According to various exemplary embodiments of the present invention, the controller 200 may generate control signals for controlling various modules, devices, etc. built in the personal mobility 1 to control the operation of each component.

Furthermore, the controller 200 may include a memory in which programs that perform operations described above and below and various data related thereto are stored, and a processor that executes programs stored in the memory. Furthermore, the controller 200 may be integrated into a System On Chip (SOC) built into the personal mobility 1 and may be operated by the processor. However, since there is not only one SOC embedded in the personal mobility 1, but may be a plurality of SOCs, it is not limited to being integrated into only one SOC.

The controller 200 may be implemented through at least one type of storage medium such as Flash memory type, Hard disk type, Multimedia card micro type, Card type of memory (e.g., SD or XD memory, etc.), RAM (Random Access Memory: RAM), Static Random Access Memory (SRAM), ROM (Read-Only Memory), EEPROM (Electrically Erasable Programmable Read-Only Memory), PROM (Programmable Read-Only Memory), Magnetic memory, Magnetic disk. However, it is not limited thereto, and may be implemented in any other form known in the art.

Figure 4:
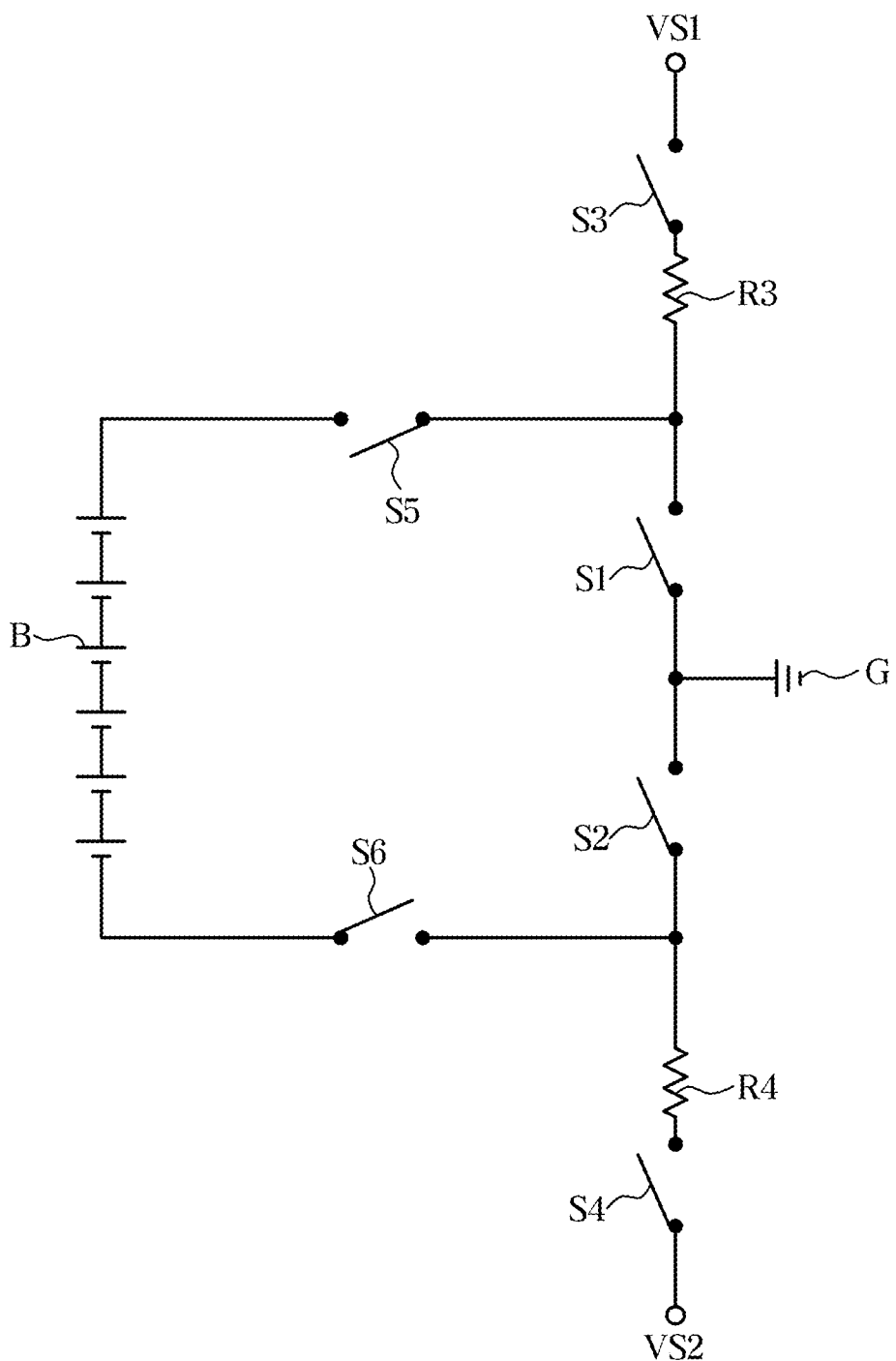
FIG. 4 is a view exemplarily illustrating an actual detection circuit according to various exemplary embodiments of the present invention.

FIG. 4 is a view exemplarily illustrating an actual detection circuit according to various exemplary embodiments of the present invention.

Referring to FIG. 4, a circuit in which the first resistance and the second resistance are not actually present in FIG. 3 is illustrated.

That is, the circuit is actually applied when a test is detected, and in the instant case, the leakage current may be identified by measuring the first voltage and the second voltage, which are voltages applied to the first switch S1 and the second switch S2. The detection circuit may include the first test voltage source VS1, the second test voltage source VS2, the first switch S1, the second switch S2, the third switch S3, the fourth switch S4, the fifth switch S5, the sixth switch S6, the battery B, and the ground G. In the instant case, when no the leakage current occurs, the voltage applied to the first switch S1 and the second switch S2 may be the value close to zero. Therefore, it may be determined that it is a safe state without the leakage current. The occurrence of leakage current is the same as the case described above and the case described below.

Figure 5:
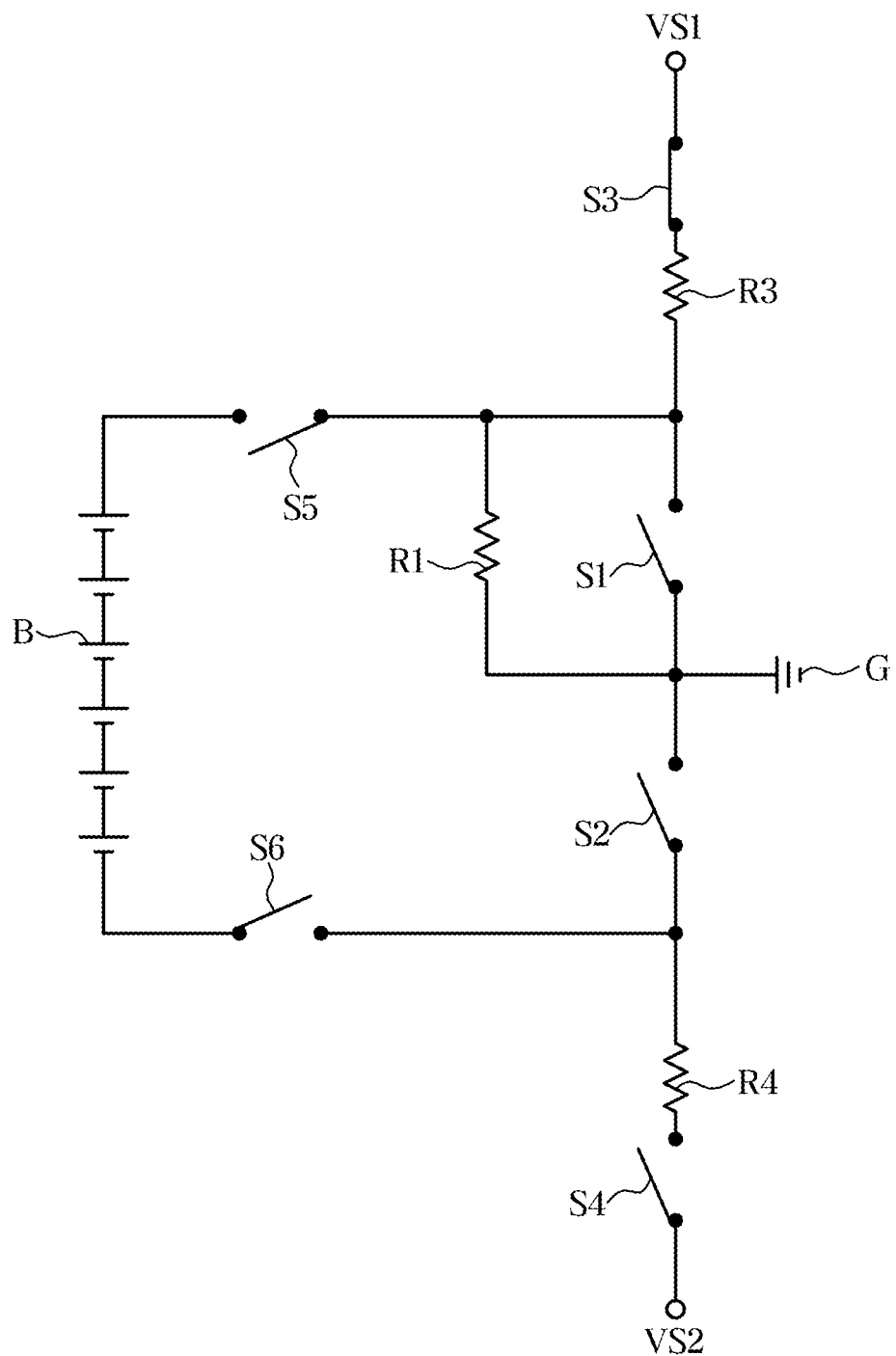
FIG. 5 is a view exemplarily illustrating a circuit in which a positive (+) electrode of a battery becomes short according to various exemplary embodiments of the present invention.

FIG. 5 is a view exemplarily illustrating a circuit in which a positive (+) electrode of a battery becomes short according to various exemplary embodiments of the present invention.

Referring to FIG. 5 in detail, when the startup of the personal mobility 1 is turned on (S100), the test may be started to identify the leakage current. FIG. 5 is a circuit diagram configured by virtually generating the first resistance R1 by shorting the positive (+) electrode of the battery B. This is because, when the short circuit occurs, a phenomenon such as that the virtual resistance is connected in parallel to the first switch S1 may occur. When starting the test, the first voltage, which is the voltage applied between the positive (+) electrode of the battery B and the main body of the personal mobility 1, may be measured, and the second voltage, which is the voltage applied between the negative (−) electrode of the battery B and the main body of the personal mobility 1, may be measured, but there may be no limit to the order. First, to determine the voltage applied between the positive (+) electrode of the battery B and the main body of the personal mobility 1, the controller 200 may control the detection circuit to electrically connect the first test voltage source VS1 and the first resistance R1 through the third switch S3 and open the fourth switch S4.

Electrical connection through the switch may refer to closing the switch to allow the current to pass through and shorting the switch. When the third switch S3 is closed, the first test voltage source VS1 and the first resistance R1 may be connected. At the instant time, when the fourth switch S4 is opened, the first voltage may be measured based on the voltage output from the first test voltage source VS1 by blocking the voltage from the second test voltage source VS2. The fifth switch S5 may be opened together to cut off the voltage from the positive electrode of the battery B as well as the fourth switch S4, and the second switch S2 and the sixth switch S6 may also be opened to measure only the first voltage applied to the first resistance R1. That is, when the third switch S3 is closed, all of the first switch S1, the second switch S2, the fourth switch S4, the fifth switch S5, and the sixth switch S6 may be opened. In the instant case, the method of measuring the first voltage may be based on a voltage distribution principle.

Referring to FIG. 5, the power may be supplied from the first test voltage source VS1, and the current may flow only to the first resistance R1 and the third resistance R3. Therefore, the voltage applied to the first resistance R1 may be expressed as a value obtained by multiplying the voltage flowing from the first test voltage source VS1 by a value of the first resistance R1 and dividing a value of the first resistance R1 plus a value of the third resistance R3 according to the voltage distribution principle.

Figure 6:
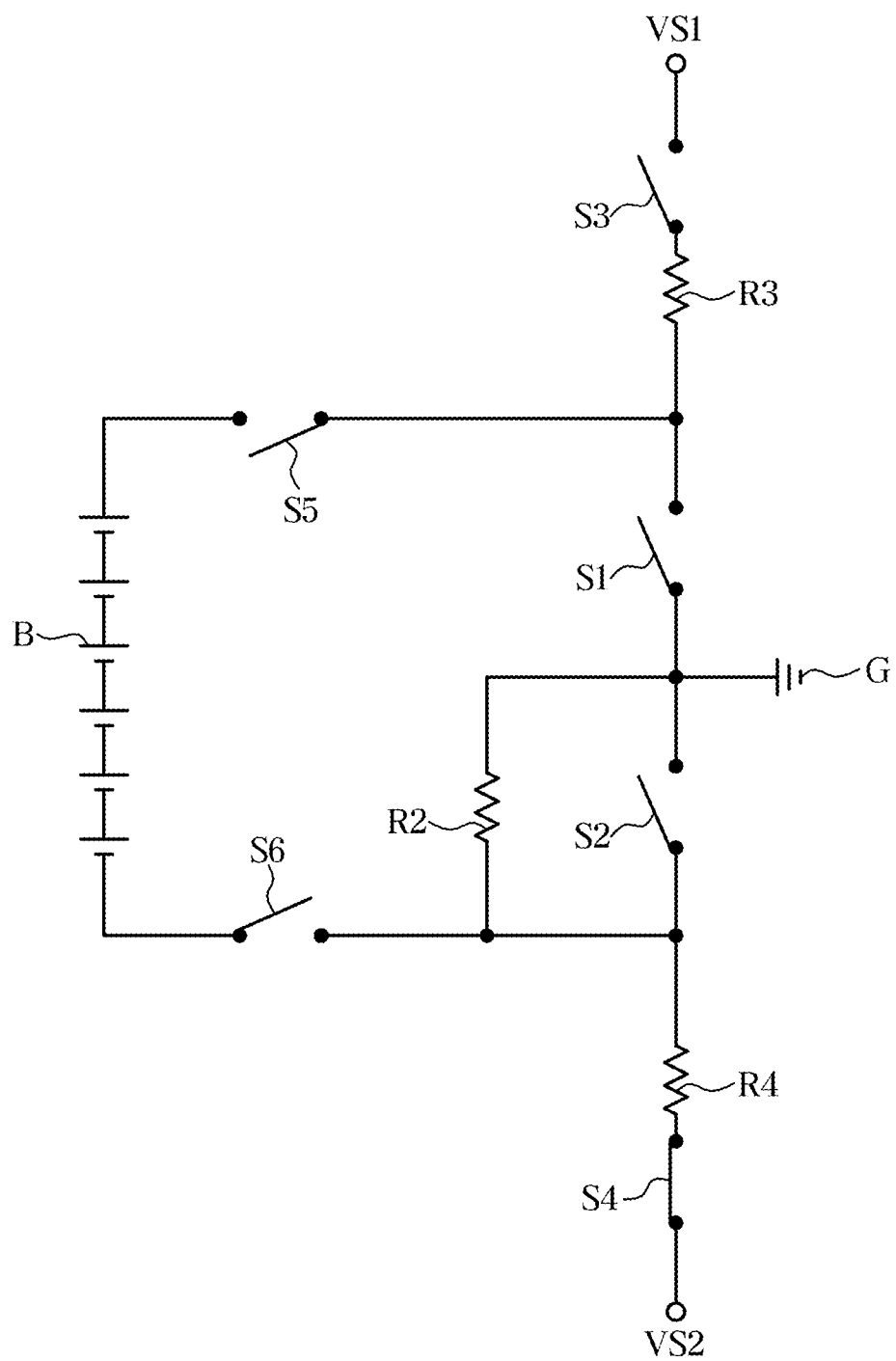
FIG. 6 is a view exemplarily illustrating a circuit in which a negative (−) electrode of a battery becomes short according to various exemplary embodiments of the present invention.

FIG. 6 is a view exemplarily illustrating a circuit in which a negative (−) electrode of a battery becomes short according to various exemplary embodiments of the present invention.

Referring to FIG. 6 in detail, FIG. 6 is a circuit diagram configured by virtually generating the second resistance R2 by shorting the negative (−) electrode of the battery B.

The controller 200 may control the detection circuit to electrically connect the second test voltage source VS2 and the second resistance R2 through the fourth switch S4 and open the third switch S3. The controller 200 may measure only the second voltage applied to the second resistance R2 by electrically connecting the second test voltage source VS2 and the second resistance R2 through the fourth switch S4 to open all of the first switch S1, the second switch S2, the third switch S3, the fifth switch S5, and the sixth switch S6. In the instant case, the method of measuring the second voltage may be based on the voltage distribution principle.

Referring to FIG. 6, the power may be supplied from the second test voltage source VS2, and the current may flow only to the second resistance R1 and the fourth resistance R4. Therefore, the voltage applied to the second resistance R2 may be expressed as a value obtained by multiplying the voltage flowing from the second test voltage source VS2 by a value of the second resistance R2 and dividing a value of the second resistance R2 plus a value of the fourth resistance R4 according to the voltage distribution principle.

Figure 7:
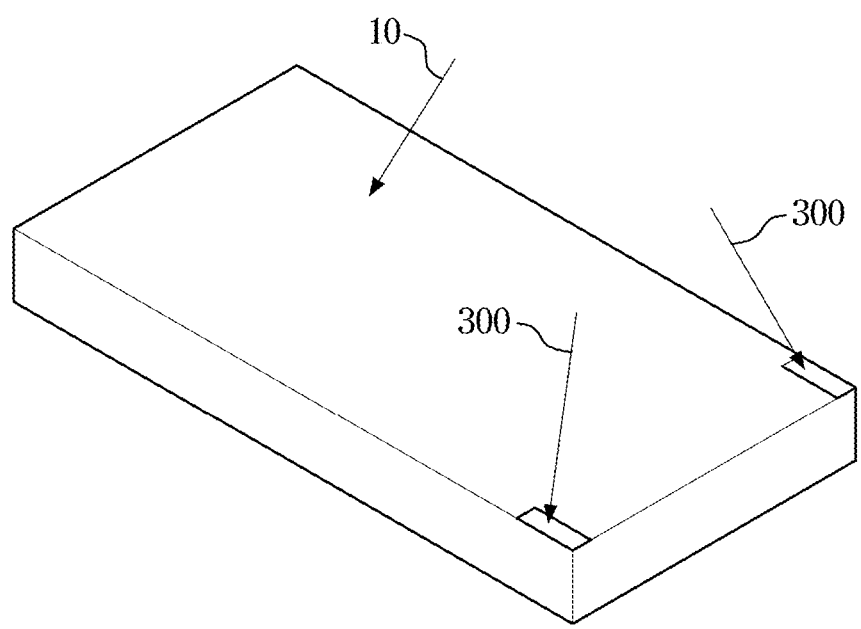
FIG. 7 is a view exemplarily illustrating an apparatus of measuring a user's weight according to various exemplary embodiments of the present invention.

FIG. 7 is a view exemplarily illustrating an apparatus of measuring a user's weight according to various exemplary embodiments of the present invention.

Referring to FIG. 7 in detail, the second sensor 300 may be located in a main body 10 of the personal mobility 1. The second sensor 300 may include a pressure sensor. When a certain amount of pressure or more is applied, the second sensor 300 may recognize as the adults, and when the certain amount of pressure or less is applied, the second sensor 300 may recognize as the children. In the instant case, in the case of shared personal mobility 1, information related to a driver's license is often held. Accordingly, it is possible to recognize the adults and the children by use of the information of the driver's license and assign the user to the adult group or the children group. As described above, not only the adult group or the children group, but also variously subdivided groups may be determined and assigned.

Figure 8:
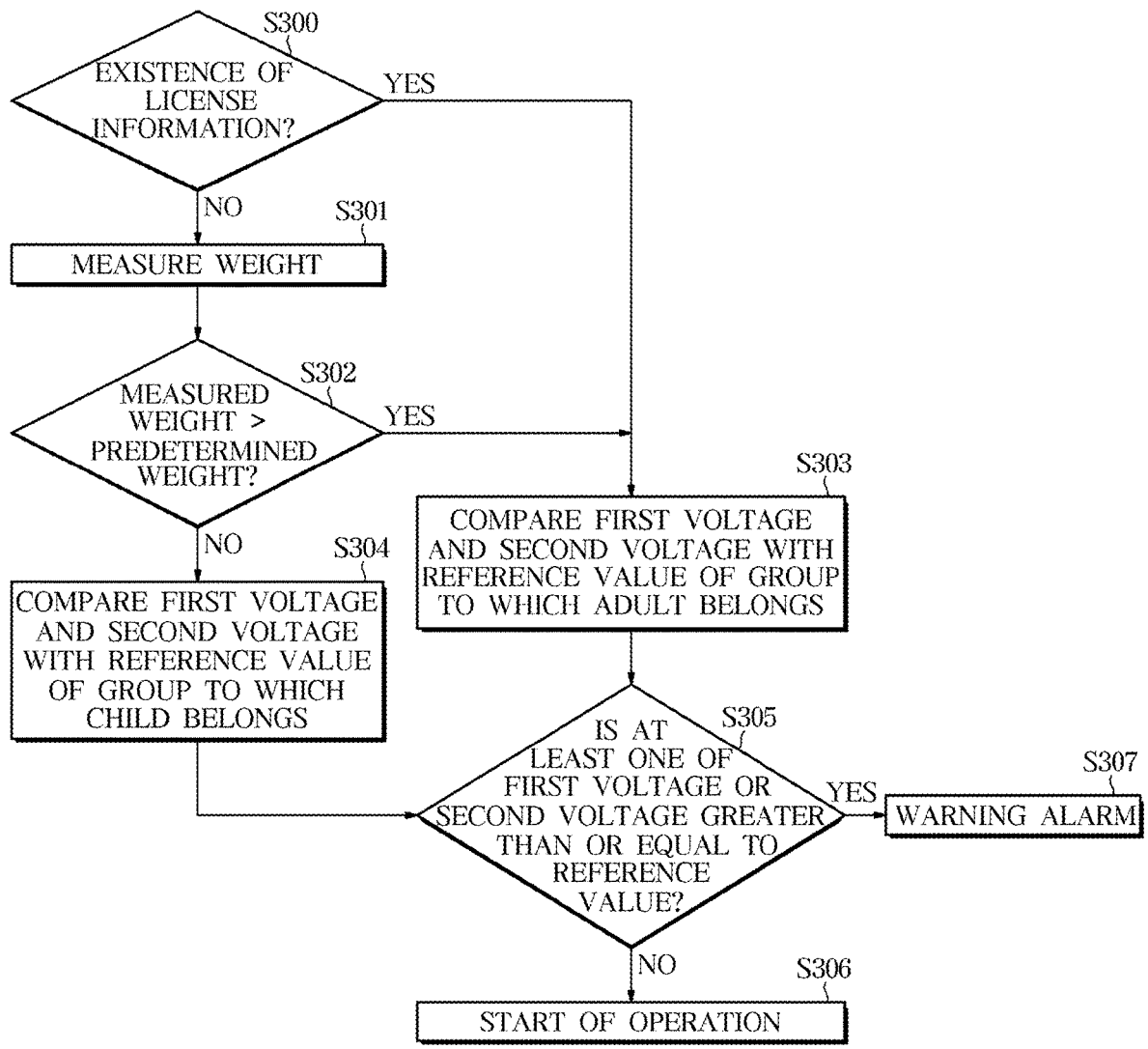
FIG. 8 is a flow chart according to various exemplary embodiments of the present invention.

FIG. 8 is a flow chart according to various exemplary embodiments of the present invention.

The controller 200 may identify whether the driver's license information exists before or after the personal mobility 1 is started. As described above, reference authentication information may refer to the driver's license information of people who have obtained the driver's license, and may include information which is a reference for authenticating the user 2 by various methods.

The controller 200 may determine whether the driver's license information exists (S300), and if it exists, the controller 200 may determine that the driver is the adult holding the driver's license and compare the first voltage and the second voltage with the reference value of the group to which the adult belongs (S303).

By comparison, the controller 200 may determine whether at least one of the first voltage or the second voltage is greater than or equal to the predetermined reference value (S305), and may provide the warning alarm if it is greater than or equal to the reference value (S307).

When it is less than that, the controller 200 may start the driving (S306).

When the license information does not exist, the controller 200 may measure the weight through the second sensor (S301). When the measured weight is greater than or equal to the predetermined weight, the controller 200 may determine that it is the adult, and then continue to perform the above-described step S303.

When the measured weight is less than the predetermined weight, the controller 200 may determine as the child, and may compare the first voltage and the second voltage with the reference value of the group to which the child belongs (S306). Thereafter, the controller 200 may determine whether at least one of the first voltage or the second voltage is greater than or equal to the predetermined reference value (S305).

When it is more than the reference value, if it is less than the warning alarm (S307), the controller 200 may start the driving (S306). To start the driving may refer to start a traveling.

According to the exemplary embodiments of the present invention, the personal mobility and the method of controlling the personal mobility may obtain the voltage applied to the resistance between the positive and negative electrodes of the battery and the main body, and determine whether there is the short circuit by comparing a reference value according to each the obtained voltage with a weight, preventing accidents and improving a user stability.

The disclosed exemplary embodiments may be implemented in a form of a recording medium storing computer-executable instructions that are executable by a processor. The instructions may be stored in a form of a program code, and when executed by a processor, the instructions may generate a program module to perform operations of the disclosed exemplary embodiments. The recording medium may be implemented non-transitory as a non-transitory computer-readable recording medium.

The non-transitory computer-readable recording medium may include all types of recording media storing commands which may be interpreted by a computer. For example, the non-transitory computer-readable recording medium may be, for example, ROM, RAM, a magnetic tape, a magnetic disc, flash memory, an optical data storage device, and the like.

Furthermore, the term related to a control device such as "controller", "control unit", "control device" or "control module", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present invention. The control device according to exemplary embodiments of the present invention may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may generate a control signal according to the processing result.

The control device may be at least one microprocessor operated by a predetermined program which may include a series of commands for carrying out the method disclosed in the aforementioned various exemplary embodiments of the present invention.

The aforementioned invention can also be embodied as computer readable codes on a computer readable recording medium. The computer readable recording medium is any data storage device that can store data which may be thereafter read by a computer system. Examples of the computer readable recording medium include hard disk drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet).

In various exemplary embodiments of the present invention, each operation described above may be performed by a control device, and the control device may be configured by multiple control devices, or an integrated single control device.

In various exemplary embodiments of the present invention, the control device may be implemented in a form of hardware or software, or may be implemented in a combination of hardware and software.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A personal mobility comprising:
   an alarm device;
   a detection circuit including a first test voltage source, a second test voltage source, a first switch, a second switch, and a ground;
   a first sensor configured to detect outputs of the first test voltage source and the second test voltage source;
   a second sensor configured to obtain weight information of a user; and
   a controller configured to:
      in response to a startup of the personal mobility, measure a first voltage applied to the first switch provided between the first test voltage source and the ground through the first sensor and a second voltage applied to the second switch provided between the second test voltage source and the ground,
      assign the user to one of a plurality of predetermined groups according to the obtained weight information of the user, and
      when the controller determines that at least one of the first voltage or the second voltage is greater than or equal to a reference value by comparing the first voltage and the second voltage with the reference value previously allocated to a group to which the user is assigned among the plurality of predetermined groups, control the alarm device electrically or wirelessly connected to the controller, to provide a warning alarm to the user.

2. The personal mobility of claim 1, wherein
   the detection circuit further includes a third switch located between the first test voltage source and the first switch, and a fourth switch located between the second test voltage source and the second switch; and
   the controller is configured to:
      electrically connect the first test voltage source and the first switch through the third switch,
      open the fourth switch to detect the first voltage, and
      control the detection circuit to determine whether a short circuit occurs in a positive (+) electrode of a battery based on the first voltage.

3. The personal mobility of claim 2, wherein the controller is configured to:
   electrically connect the second test voltage source and the second switch through the fourth switch,
   open the third switch to detect the second voltage, and
   control the detection circuit to determine whether the short circuit occurs in a negative (−) electrode of the battery based on the second voltage.

4. The personal mobility of claim 3, further including:
   the battery, a fifth switch, and a sixth switch,
   wherein the fifth switch is located between the positive (+) electrode of the battery and the third switch;
   wherein the sixth switch is located between the negative (−) electrode of the battery and the fourth switch; and
   wherein the controller is configured to:
      in a case of electrically connecting the first test voltage source and the first switch through the third switch, control the detection circuit to detect the first voltage by opening the first switch, the second switch, the fourth switch, the fifth switch, and the sixth switch, and
      in a case of electrically connecting the second test voltage source and the second switch through the fourth switch, control the detection circuit to detect the second voltage by opening the first switch, the second switch, the third switch, the fifth switch, and the sixth switch.

5. The personal mobility of claim 1, further including:
   a storage electrically connected to the controller and configured to store reference authentication information,
   wherein the controller is configured to compare an authentication device of the user with the reference authentication information and assign the user to one of the plurality of predetermined groups according to the reference authentication information corresponding to the authentication device of the user.

6. The personal mobility of claim 1, wherein, in a response to a case of stopping of the personal mobility for a predetermined time period or longer than the predetermined time period while driving the personal mobility, the controller is configured to control the alarm device to provide the warning alarm to the user when the controller determines that the at least one of the first voltage or the second voltage is equal to or greater than the reference value.

7. The personal mobility of claim 6, further including:
   a communicator electrically connected to the controller and configured to transmit a warning signal to a management server,
   wherein the controller is configured to control to transmit the warning signal to the management server through the communicator when the controller determines that the at least one of the first voltage or the second voltage corresponds to the reference value or more.

8. The personal mobility of claim 1, wherein when the controller determines that the at least one of the first voltage or the second voltage is lower than reference value, the controller is configured to start operation of the personal mobility.

9. A method of controlling a personal mobility including a detection circuit of a first test voltage source, a second test voltage source, a first switch, a second switch, and a ground, the method comprising:
- detecting, by a first sensor, outputs of the first test voltage source and the second test voltage source;
- obtaining, by a second sensor, weight information of a user;
- in response to a startup of the personal mobility, measuring, by a controller, a first voltage applied to the first switch provided between the first test voltage source and the ground through the first sensor and a second voltage applied to the second switch provided between the second test voltage source and the ground;
- assigning, by the controller, the user to one of a plurality of predetermined groups according to the obtained weight information obtained through the first sensor; and
- when the controller determines that at least one of the first voltage or the second voltage is greater than or equal to a reference value by comparing the first voltage and the second voltage with the reference value previously allocated to a group to which the user is assigned among the plurality of predetermined groups, providing, by the controller, a warning signal to the user.

10. The method of claim 9,
wherein the detection circuit further includes a third switch located between the first test voltage source and the first switch, and a fourth switch located between the second test voltage source and the second switch; and
wherein the measuring of the first voltage includes:
- electrically connecting the first test voltage source and the first switch through the third switch, and
- controlling the detection circuit to open the fourth switch.

11. The method of claim 10, wherein the measuring of the second voltage includes:
- electrically connecting the second test voltage source and the second switch through the fourth switch, and
- controlling the detection circuit to open the third switch.

12. The method of claim 11,
wherein the detection circuit further includes the battery, a fifth switch, and a sixth switch;
wherein the fifth switch is located between the positive (+) electrode of the battery and the third switch;
wherein the sixth switch is located between the negative (−) electrode of the battery and the fourth switch; and
wherein the measuring of the first voltage and the second voltage includes:
- in a case of electrically connecting the first test voltage source and the first switch through the third switch, controlling, by the controller, the detection circuit to open the first switch, the second switch, the fourth switch, the fifth switch, and the sixth switch, and
- in a case of electrically connecting the second test voltage source and the second switch through the fourth switch, controlling, by the controller, the detection circuit to open the first switch, the second switch, the third switch, the fifth switch, and the sixth switch.

13. The method of claim 9, wherein the assigning of the user to one of the plurality of predetermined groups includes:
- comparing an authentication device of the user with reference authentication information and assigning the user to one of the plurality of predetermined groups according to the reference authentication information corresponding to the authentication device of the user.

14. The method of claim 9, further including:
- in a response to a case of stopping of the personal mobility for a predetermined time period or longer than the predetermined time period while driving the personal mobility, providing, by the controller, the warning signal to the user through an alarm device when the controller determines that at least one of the first voltage or the second voltage is equal to or greater than the reference value.

15. The method of claim 14, further including:
- controlling, by the controller, a communicator to transmit the warning signal to a management server through the communicator electrically or wirelessly connected to the controller when the controller determines that the at least one of the first voltage or the second voltage corresponds to the reference value or more than the reference value.

16. The method of claim 9, wherein when the controller determines that the at least one of the first voltage or the second voltage is lower than reference value, the controller is configured to start operation of the personal mobility.

* * * * *